United States Patent [19]

Dara

[11] Patent Number: 4,876,630
[45] Date of Patent: Oct. 24, 1989

[54] MID-PLANE BOARD AND ASSEMBLY THEREFOR

[75] Inventor: Prithipal Dara, Richardson, Tex.

[73] Assignee: Reliance Comm/Tec Corporation, Chicago, Ill.

[21] Appl. No.: 250,974

[22] Filed: Sep. 23, 1988

Related U.S. Application Data

[63] Continuation of Ser. No. 65,025, Jun. 22, 1987, abandoned.

[51] Int. Cl.⁴ .............................................. H05K 01/18
[52] U.S. Cl. ..................................... 361/413; 361/415; 361/416
[58] Field of Search ............... 361/412, 413, 415, 416, 361/394

[56] References Cited

U.S. PATENT DOCUMENTS

| | | | |
|---|---|---|---|
| 3,205,298 | 9/1965 | Kalt ................................ | 361/412 X |
| 3,238,420 | 3/1966 | Simonneau et al. ............... | 361/412 |
| 3,312,878 | 4/1967 | Poch et al. ....................... | 361/413 |
| 3,808,566 | 4/1974 | Thompson et al. .............. | 361/416 X |
| 4,307,438 | 12/1981 | Grubb ............................. | 361/412 X |
| 4,356,461 | 10/1982 | Acroraci ......................... | 333/116 |
| 4,472,765 | 9/1984 | Hughes ............................ | 361/413 |
| 4,612,519 | 9/1986 | Gargini et al. .................. | 333/103 |
| 4,703,394 | 10/1987 | Petit et al. ..................... | 361/413 |
| 4,777,615 | 10/1988 | Potash ............................ | 361/413 X |

FOREIGN PATENT DOCUMENTS 52-22425 2/1977 Japan .................................. 361/415

OTHER PUBLICATIONS

Tsui et al., Double Board Arrangement, IBM Tech. Disc. Bull., V. 13, #6, Nov. 1970, pp.; 1411 or 1412 relied on.
Siliconix Incorporated—Catalog page for DG536 Type Multiplexer—Dated Apr. 1986.

*Primary Examiner*—R. R. Kucia
*Attorney, Agent, or Firm*—Michael M. Rickin

[57] ABSTRACT

A mid-plane board for orthogonally interconnecting a first set of circuit boards to a second set of circuit boards. The mid-plane board has a first group of pins which project outwardly equally on both sides of the board. It has second and third groups of pins which project outwardly only on one or the other side of the mid-plane board, respectively. The circuit boards have edge connectors and the pins of the first, second and third groups are associated with the edge connectors in a manner such that the circuit boards of the first set are orthogonal to those of the second set when they are connected to the pins. An assembly for the mid-plane board and the circuit boards is also disclosed.

2 Claims, 4 Drawing Sheets

MID-PLANE BOARD AND ASSEMBLY THEREFOR

This is a continuation of co-pending application Ser. No. 065,025, filed on June 22, 1987, now abandoned.

BACKGROUND OF THE INVENTION

1. Field of the Invention

The present invention relates to the mechanical arrangement for interconnecting multiple electrical circuits and more particularly to a mid-plane board for use therein.

2. Description of the Prior Art

A three-dimensional structure for a circuit having a plurality of inputs and outputs is particularly well suited for use in a cross connect network for digital signals transmitted at a high rate, e.g., DS3. The three-dimensional structure provides interconnections which are relatively short and direct as compared to those provided when the inputs and outputs are wired to each other. The relatively short and direct interconnections reduce signal cross talk, attenuation and distortion.

One example of a three-dimensional structure is described in U.S. Pat. No. 4,472,765 (hereinafter the '765 patent). While that structure may become quite complex, in its simplest form it includes a single motherboard and two groups of zero-insertion-force (ZIF) connectors. The two groups of connectors are connected on opposite sides of the motherboard in an orthogonal relationship to each other. Each connector has associated therewith on the motherboard a double row or column of plated through holes. The double row of pins on each ZIF connector are forced into the holes on the board. Only certain pins are used for connecting circuits on a circuit card located on one side of the board to a circuit card located on the other side of the board.

Mounting of the connectors on the motherboard as disclosed in the '765 patent is not desirable. If that board were to be replaced, then it would either be necessary to remove the connectors from the board for use on the new board or have the new board already have such connectors installed thereon. Should the structure be used to interconnect a multiplicity of input and output circuit cards, then such design is wasteful of the connectors. In addition, the structure shown in the '765 patent is not particularly well suited where it is desired to interconnect a multiplicity of input and output lines, each associated with a respective one of the circuit cards to each other. In the structure shown in the '765 patent, each circuit card is also connected to an edge connector for the purposes of making auxiliary connections thereto. Also the structure of the '765 patent requires that there be associated with each card an elongate card guide opposite the ZIF connector associated with the card.

I have found that all of the control signals necessary to perform the desired interconnection between the input and output lines as well as all of the power signals for the input and output circuit cards can be applied directly to the mid-plane board. In addition, I have found that it is not necessary to use elongate card guides in order to bring the cards into contact with the mid-plane board. In the structure of my invention simple slots suffice.

SUMMARY OF THE INVENTION

A mid-plane board which has first and second sides. A first group of at least four pins projects outwardly on both sides. These pins are associated with connectors mounted on first and second groups of circuit cards wherein each group has at least two circuit cards. At least two of the pins are associated with the connectors on a respective one of the first group of cards and the connectors on a respective one of the second group of cards.

The board also has a second group of at least two pins which project outwardly only on the first side. These pins are associated with a respective one of the connectors on the first group of cards. Finally, the board has a third group of at least two pins which project outwardly only on the second side. These pins are associated with a respective one of the connectors on the second group of cards. The pins of the three groups of pins are associated with their respective connectors such that when the connectors of the first group are connected to their pins and the connectors of the second group are connected to their pins, the first group of cards is in an orthogonal relationship to the second group of cards.

DESCRIPTION OF THE DRAWING

FIG. 2A shows the layout for the mid-plane board's ground layers whereas

DESCRIPTION OF THE PREFERRED EMBODIMENT

Figure 1:
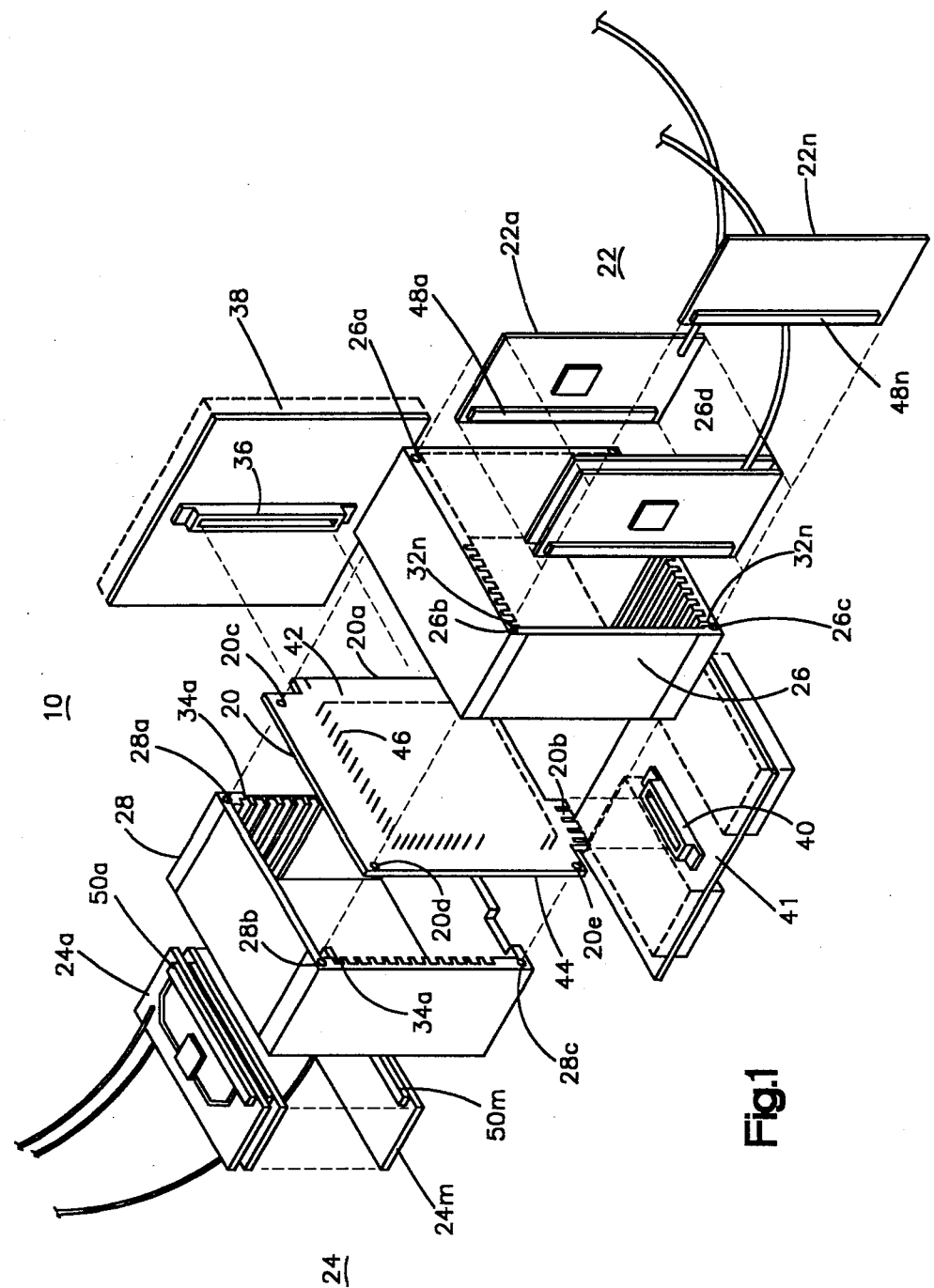
FIG. 1 shows an exploded perspective of an assembly which includes the mid-plane board of the present invention.

Referring to FIG. 1 there is shown an exploded perspective of an assembly 10 which includes therein the mid-plane board 20 of the present invention. Assembly 10 includes a first group 22 of circuit cards 22a to 22n each having an associated one of conventional edge connectors 48a to 48n. It also includes a second group 24 of circuit cards 24a to 24m each having an associated one of conventional edge connectors 50a to 50m. Cards 22a to 22n are in an orthogonal relationship to cards 24a to 24m. Mid-plane board 20 allows each of circuit cards 22a to 22n to be interconnected to circuit cards 24a to 24m in any combination as desired. A particular application in which board 20 may be used will be described hereinafter in connection with FIG. 3.

Assembly 10 further includes a housing 26 for cards 22a to 22n, and a housing 28 for cards 24a to 24m. Each housing 26, 28 has therein a multiplicity of pairs of slots each associated with a respective one of the cards. In particular, housing 26 has slots pairs 32a to 32n each associated with a respective one of cards 22a to 22n, and housing 28 has slots pairs 34a to 34m each associated with a respective one of cards 24a to 24m. For ease of illustration, only a portion of the slots pairs in each housing has been shown in FIG. 1. As can be seen in FIG. 1, cards 22a to 22n are mounted in the associated ones of slots pairs 32a to 32n of housing 26 vertically whereas cards 24a to 24m are mounted in the associated ones of slots pairs 34a to 34m of housing 28 horizontally. The slots pairs act not only as guides for the cards inserted therein but also provide support thereto.

Mid-plane board 20 includes a rightwardly extending connection portion 20a which interconnects with a connector 36 mounted on the logic control board 38 of assembly 10. Board 20 also includes a downwardly extending connection portion 20b which interconnects with a connector 40 mounted on the power supply board 41 of assembly 10. The combination of connection portion 20a and connector 36 and connection portion 20b and connector 40 may be used to provide control signals and power signals to assembly 10 so that board 20 can provide the desired interconnection between cards 22a to 22n and cards 24a to 24m.

Mid-plane board 20 is multilayered and has first and second sides 42 and 44. Mounted on each side are a multiplicity of outwardly projecting pins 46. As will be described in more detail hereinafter in connection with FIGS. 2A to 2B, some of the pins 46 are used to carry signals from cards 22a to 22n to cards 24a to 24m and therefore those pins project outwardly equally on both sides 42, 44 of board 20, i.e., they are double-sided pins. The remaining ones of pins 46 are used either for providing ground, logic signals or power signals to cards 22a to 22n and cards 24a to 24m. Those pins project outwardly only on the side 42, 44 wherein the particular card they are associated with is to be connected, i.e., they are single sided pins.

Mid-plane board 20 includes holes 20c, d, e and f in the four corners of the board. Housing 26 includes through holes 26a to 26d in its four corners. Housing 28 includes holes 28a to 28d suitably arranged for receiving fasteners (not shown) inserted first into holes 26a to 26d and then through holes 20c to 20f so that assembly 10 can easily be formed. Cards 22a to 22n are inserted in slots 32a to 32n such that each of the connectors 48a to 48n mounted thereon makes contact with the associated ones of pins 46 on side 42. Cards 24a to 24m are inserted in slots 34a to 34m such that each of the connectors 50a to 50m mounted thereon makes contact with the associated ones of pins 46 on side 44. Connection portion 20a is mated with connector 36 and connection portion 20b is mated with connector 40. A further structure (not shown) may then be used to enclose assembly 10.

Figure 2A:
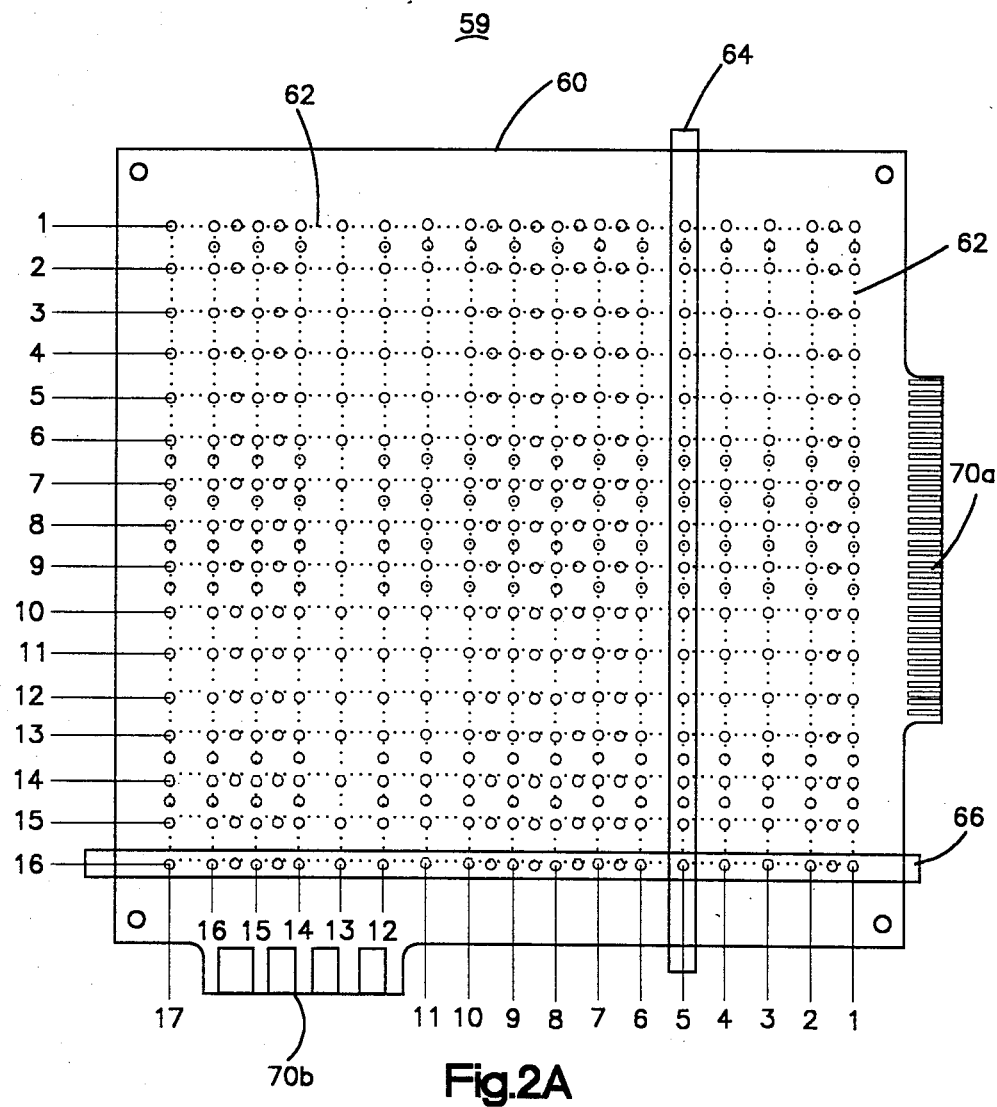

As described above, mid-plane board 20 is a multilayered board. In one embodiment, board 20 had four layers with the first and fourth layers being identical groundplanes which correspond, respectively, to sides 42 and 44. The layout for the ground planes, i.e., sides 42 and 44, is shown in FIG. 2A. The second and third layers, i.e., the layers sandwiched between sides 42 and 44, are used to carry the logic signals and power signals. The layouts for the second and third layers are shown as a composite in FIG. 2B. That composite, as will be described hereinafter, shows the interconnections with the cards 22a to 22n and 24a to 24m.

For purposes of illustration and by way of example hereinafter it is assumed in FIGS. 2A, 2B and 3 that there are 17 cards in the first group 22a to 22n, i.e., n=17 and that there are 16 cards in the second group 24a to 24m, i.e., m=16. It is further assumed that edge connectors 48a to 48n each have 63 pins and edge connectors 50a to 50m each have 67 pins.

Referring specifically to FIG. 2A there is shown the layout 59 for the two ground pane layers 60, i.e., sides 42, 44, of multilayered mid-plane board 20. Layers 60 both include a rightwardly extending connection portion 70a and a downwardly extending connection portion 70b.

Layers 60 each have 17 columns of ground pins 62 each associated with a respective one of the 17 cards in first group 22a to 22n. Layers 60 also each have 16 rows of ground pins 62 each associated with a respective one of the 16 cards in second group 24a to 24m. To aid in understanding my invention the 17 columns have been numbered 1 to 17 from right to left and the 16 rows have been numbered from 1 to 16 from top to bottom in FIG. 2A.

In addition that one 64 of the edge connectors 48a to 48n associated with the fifth one of the cards 22a to 22n, i.e., numbered column 5, and that one 66 of the edge connectors 50a to 50m associated with the sixteenth one of the cards 24a to 24m, i.e., numbered row 16, are shown both symbolically in FIG. 2A. If all of the other edge connectors associated with cards 22a to 22n were also shown in FIG. 2A it would be clear that edge connector 66 has a unique ground interconnection with each of the 17 cards in first group 22a to 22n. Similarly, if all of the other edge connectors associated with cards 24a to 24m were also shown in FIG. 2A it would be clear that edge connector 64 has a unique ground interconnection with each of the 16 cards in second group 24a to 24m.

Figure 2B:
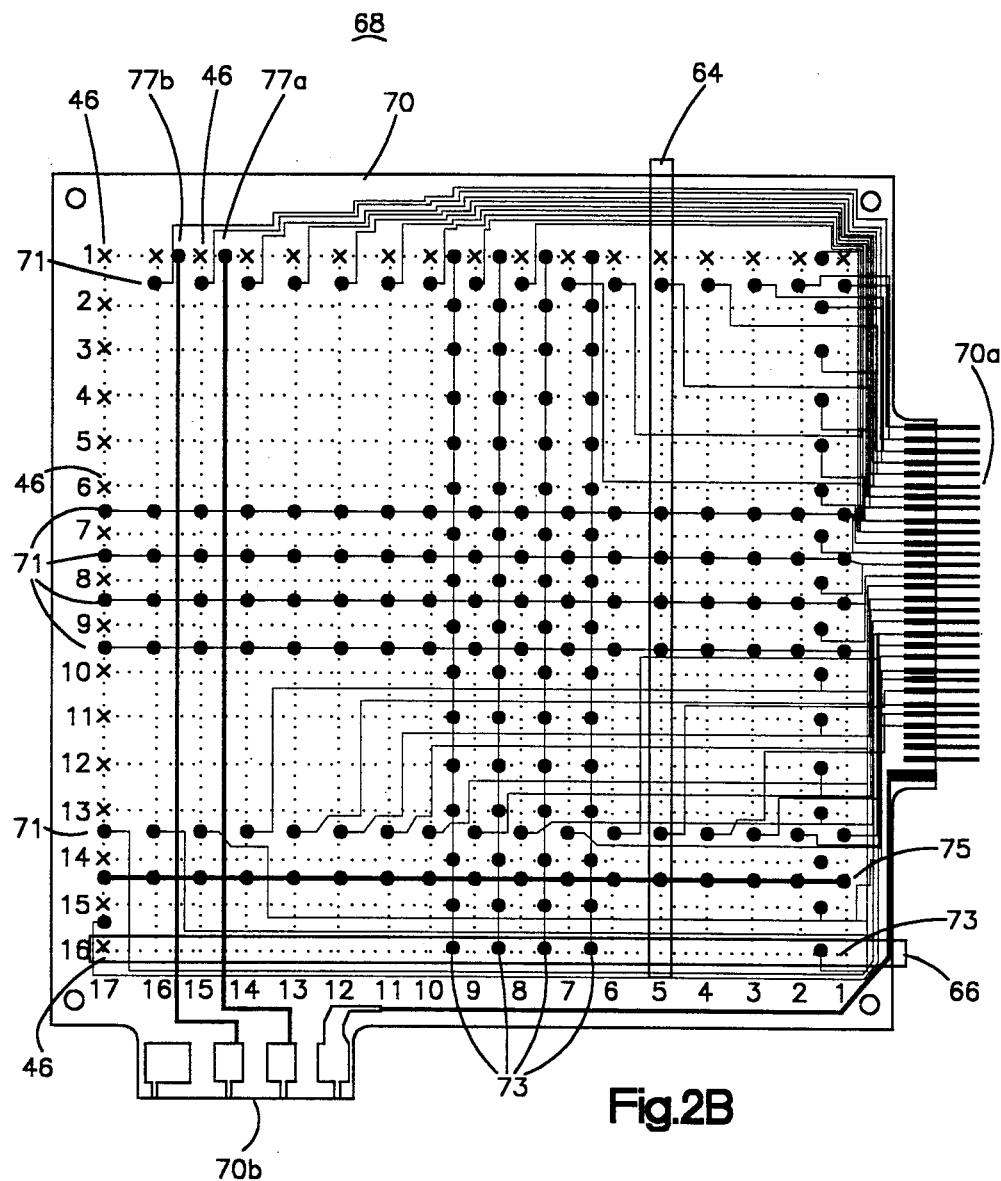
FIG. 2B shows the composite layout for the other layers of the board.

Referring now to FIG. 2B there is shown the layout 68 for the second and third layers of multilayered mid-plane board 20 after those layers have been placed one on top of the other. When the two layers are placed one on top of the other they, in effect, form a "single layer" and the layout 68 will be referred to hereinafter as that for a single layer 70. Either one or both of the second or third layers of board 20 may be used to carry the logic signals and the power signals. The choice of which of the two layers carries which signals is immaterial.

Layer 70 includes a rightwardly extending portion 70a which is used to carry the logic signals and a downwardly extending portion 70b which is used to carry the power signals. As with the layout 59 shown in FIG. 2A the 17 columns of layer 70 have been numbered from 1 to 17 from right to left and the 16 rows have been numbered from 1 to 16 from top to bottom in FIG. 2B. Also as with the layout 59 shown in FIG. 2A that one 64 of the edge connectors 48a to 48n associated with the fifth one of the cards 22a to 22n, i.e., numbered column 5, and that one 66 of the edge connectors 50a to 50m associated with the sixteenth one of the cards 24a to 24m, i.e., numbered row 16, are both shown symbolically in FIG. 2B.

As previously described in connection with FIG. 1, some of the pins 46 on board 20 are used to carry signals from cards 22a to 22n to cards 24a to 24m and therefore project outwardly equally on both sides 42, 44 of the board. Those pins are double sided. Each of the 17 columns has 16 of those pins. Each of the 16 rows has 17 of those pins. In total, board 20 has 16×17 or 272 of those pins 46. In order to avoid unduly cluttering FIG. 2B only the double sided pins 46 in the first row and the seventeenth column have been identified by an "X". The location of the unidentified remaining ones of the 272 pins 46 should now be self-evident. The remaining pins shown in FIG. 2B protrude only one side 42, 44 of board 20. Those pins carry either logic signals, power signals or act as connections to the ground layers 60. The grounds on cards 22a to 22n and 24a to 24m are interconnected to each other by the associated ground pins being connected to the two ground layers 60.

With regard to the logic signals, these enter layer 70 through connection portion 70a. The logic signals must be provided to both cards 22a to 22n and 24a to 24m as needed. As described above, the edge connectors 48a to 48n associated with cards 22a to 22n are in this embodiment for board 20 connected to the pins on the board in columns 1 to 17. Also as described above, the edge connectors 50a to 50m associated with cards 24a to 24m are in this embodiment for board 20 connected to the pins on the board in rows 1 to 16.

The logic signals for cards 22a to 22n are provided by the sets of connection pins identified collectively as 71. As can be seen, the connector 64 associated with numbered column 5 connects to those ones of connection pins 71 which are in column 5. It should now be clear that the other unshown remaining connectors 64, i.e., the connectors associated with numbered columns 1 to 4, 6 to 17 connect to those ones of connection pins 71 which are in the associated one of the columns.

The logic signals for cards 24a to 24m are provided by the set of connection pins identified collectively as 73. As can be seen, the connector 66 associated with numbered row 16 connects to those ones of connection pins 73 which are in row 16. It should now be clear that the other unshown remaining connectors 66, i.e., the connectors associated with numbered rows 1 to 15, connect to those ones of connection pins 73 which are in the associated one of the rows.

The four rows of connection pins 71 in the center of the layout 68 interconnect with the four columns of connection pins 73 in the center of the layout 68, at the places indicated by circles 79.

With regard to the power signals, these enter layer 70 through connection portion 70b. In the embodiment being described herein that portion provides three different voltages, viz., +5 V, +9 V and +15 V. The +5 V is directly connected to connection portion 70a where it is used to provide the needed voltage for the logic circuitry to which connection portion 70a is connected. The +9 V and +15 V are directly connected from portion 70b to layer 70.

In the embodiment being described herein the cards 22a to 22n receive only the +15 V whereas the cards 24a to 24m receive both the +9 V and the +15 V. The cards 22a to 22n receive the +15 V through the set of connection pins identified as 75. The cards 24a to 24m receive the +9 V by the set of connection pins identified as 77a and receive the +15 V by the set of connection pins identified as 77b. As can be seen, the connector 64 associated with numbered column 5 connects to the associated one of the connection pins 75 whereas the connector 66 associated with numbered row 16 connects to the associated one of connection pins 77a (to receive the +9 V) and to the associated one of connection pins 77b (to receive the +15 V). Connection pins 75 are connected to connection pins 77b at the location where they overlap on layout 68.

All of the other pins shown in FIG. 2B which have not been identified as either signals pins 46, logic pins 71, 73 and voltage pins 75, 77a, 77b are ground pins. By now comparing FIG. 2A with FIG. 2B it should be self-evident that the previously unidentified large circles shown in ground layers 60 are in fact the signal pins 46, logic pins 71, 73 and the voltage pins 75, 77a and 77b. The ground pins appear faintly as the tiny dots between pins 46, 71, 73, 75, 77a and 77b.

Figure 3:
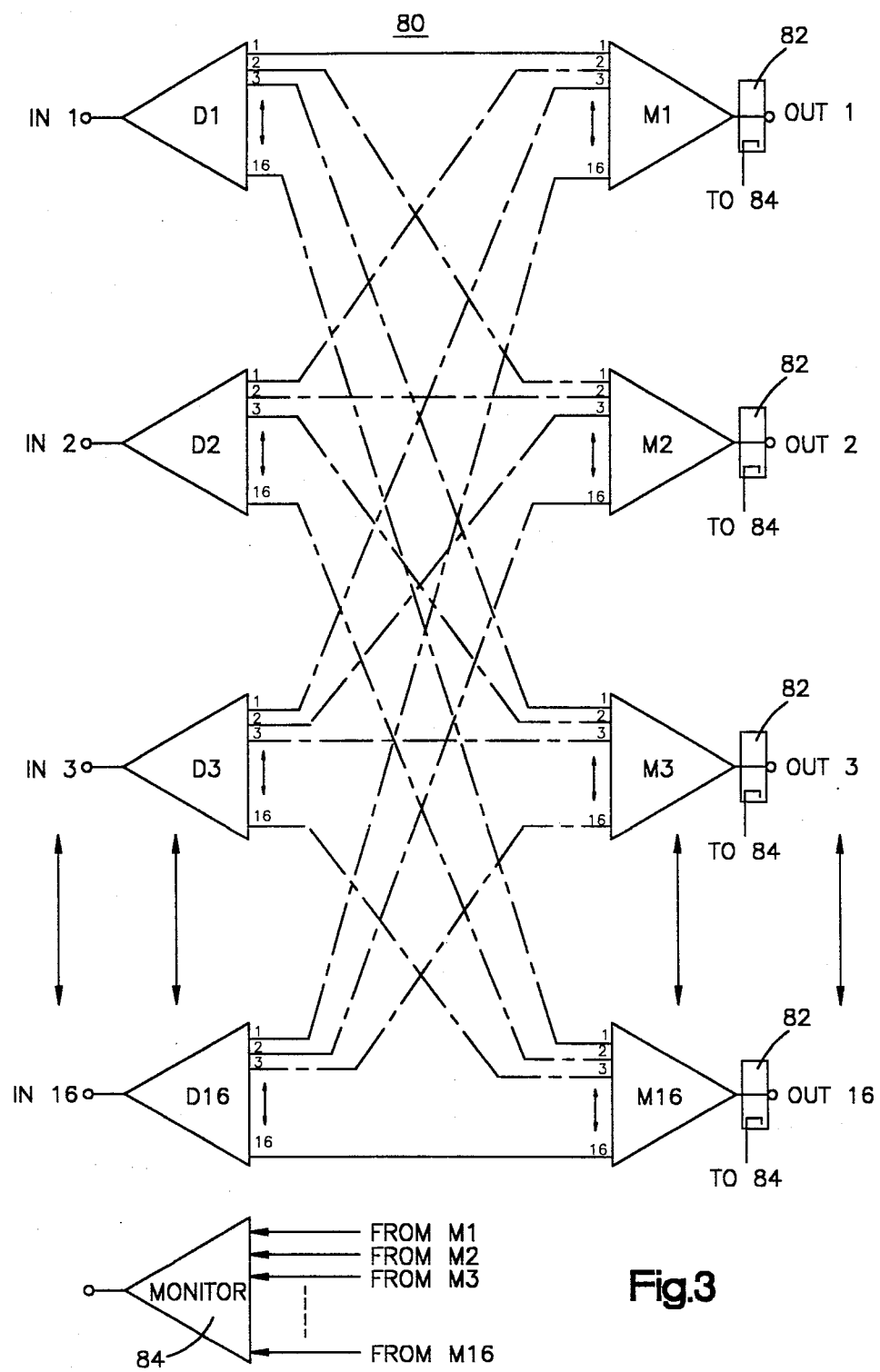
FIG. 3 shows a simplified schematic representative of a cross-connect network in which the mid-plane board of the present invention may be used.

Referring now to FIG. 3, there is shown a simplified schematic representation of a cross-connect network 80 in which mid-plane board 20 may be used. Network 80 is used to cross-connect any one of 16 input signal paths each associated with a respective one of 16 of the 17 cards in first group 22a to 22n, with any one of 16 output signal paths each associated with a respective one of the 16 cards in second group 24a to 24m. As will be described hereinafter, the 17th card in the first group is used as a monitor.

Cross-connect network 80 has 16 demultiplexers (hereinafter "demux(es)") D1 to D16 and 16 multiplexers (hereinafter "mux(es)") M1 to M16. The 16 demuxes D1 to D16 receive an associated one of the 16 signals (analog or digital) to be cross-connected. Each demux D1 to D16 has 16 outputs. Each mux M1 to M16 has 16 inputs. The 16 outputs of each demux D1 to D16 are connected to an associated one of the 16 inputs in each of muxes M1 to M16. The demuxes and muxes may be embodied by the DG536 type multiplexer available from Siliconix Incorporated of Santa Clara, Calif.

In particular, output number one of demux D1 is connected to input number one of mux M1. Output number one of demux D16 is connected to input number 16 of mux 1. In fact, the number one output of each of demuxes D1 to D16 is connected to the numbers 1 to 16 inputs, respectively, of mux M1. Similarly the number two output of each of demuxes D1 to D16 is connected to the number 1 to 16 inputs, respectively, of mux M2.

The pattern for the interconnection of the outputs of the demuxes to the inputs of the muxes in network 80 should now be clear, viz., the same numbered output of each of the demuxes D1 to D16 are connected to the inputs of the same one of the muxes M1 to M16 with the output of demux D1 always being connected to the number one input, the output of demux D2 always being connected to the number two input, etc. Demuxes D1 to D16 and muxes M1 to M16 each in effect contain internally 16 switches which are controlled by logic signals (not shown) so that a particular one of the outputs of each of the demuxes can be connected to a particular one of the inputs of the muxes. Such a connection is accomplished by closing the desired one of the 16 switches in each demux and mux. Only one switch can be closed in each demux and mux.

For example, it may be desired to route the signal into D1 so that it appears at the output of M2. Such a connection is made by signals from the logic which close the second switch in D1 and the first switch in M2. Similarly, it may be desired to route the signal into D3 so that it appears at the output of M8 (not shown). Such a connection is made by signals from the logic which close the eight switch of D3 and the third switch of M8.

It is clear that the switches in demuxes D1 to D16 and muxes M1 to M16 are controllable such that the 16 signals into the demuxes may be connected so that they appear in any desired pattern at the outputs of the 16 muxes. While the 16 demuxes and 16 muxes could be wired to each other in order to embody network 80 the same is not desirable as the resultant network would have substantial signal cross talk, high attenuation and signal distortion. It is the board 20 of the present invention which allows for network 80 to be embodied with interconnections which are relatively short and direct and therefore have reduced cross talk, attenuation and signal distortion.

The logic signals for controlling the demuxes and muxes appear at connection portion 20a whereas the power signals for the demuxes and muxes appear at connection portion 20b. Thus, the multilayered mid-plane board 20 of the present invention not only allows network 80 to be embodied so as to produce the desirable results described above, but also provides both the logic signals and the power signals for operating network 80.

As described above, the 17th card in the first group of cards 22a to 22n is used as a monitor. As shown in FIG. 3, there is connected to the output of each of muxes M1 to M16 a coupler 82. In this manner a sample of each of the signals at the output of muxes M1 to M16 can be obtained. Those samples are connected to a mux 84 which acts as the monitor. Mux 84 can be controlled by logic signals (not shown) so that any one of the 16 output signals can be monitored by a user of cross-connect network 80. While mux 84 has been shown in all of the figures as being associated with the first group of cards 22a to 22n, it should be appreciated that it is a mux and not a demux.

It should also be appreciated that the presence of the monitor card in the embodiment being described herein does not otherwise limit the ability of my multilayered mid-plane board 20 to provide all of the desirable features described above. In fact, the presence of the monitor card in the embodiment described herein points out the ability of the mid-plane board 20 to not only allow network 80 to be embodied but also to allow other desirable features to be provided. Finally, it should be appreciated that while mid-plane board 20 has been described as having two ground layers it could be embodied with only a single ground layer.

It is to be understood that the description of the preferred embodiment is intended to be only illustrative, rather than exhaustive, of the present invention. Those of ordinary skill will be able to make certain additions, deletions, and/or modifications to the embodiment of the disclosed subject matter without departing from the spirit of the invention or its scope, as defined by the appended claims.

What is claimed is:

1. An assembly comprising:
   (a) a mid-plane board having first and second sides, said board allowing a first group of at least two circuit cards each having means for connection to said first side to be interconnected in any order to a second group of at least two circuit cards having means for connection to said second side, said mid-plane board comprising:
      (i) a first group of at least four pins projecting outwardly on both said first and said second sides, at least two of said first group of pins being associated with a respective one of each of said first group and said second group connection means;
      (ii) a second group of at least two pins projecting outwardly only on said first side, at least one of said first side projecting only pins being associated with a respective one of said first group connection means; and
      (iii) a third group of at least two pins projecting outwardly only on said second side, at least one of said second side projecting only pins being associated with a respective one of said second group connection means,
   (b) a first housing having at least two card guide and support means each of said means associated with a respective one of said at least two first group circuit cards, each of said means allowing said associated one of said first group circuit cards connection means to be brought into contact with said associated ones of said first, second and third groups of pins when said associated ones of said first group circuit cards is inserted therein; and
   (c) a second housing having at least two card guide and support means each associated with a respective one of said at least two second group circuit cards, each of said means allowing said associated ones of said second group circuit cards connection means to be brought into contact with said associated ones of said first, second and third groups of pins when said associated ones of said second group circuit cards is inserted therein,
   said at least two card guide and support means of said first housing being in an orthogonal relationship to said at least two card guide and support means of said second housing, said mid-plane board, said first housing and said second housing including coaxially aligned means for assembling said assembly such that said first housing is attached to said mid-plane board first side and said second housing is attached to said mid-plane board second side when said assembly is assembled.

2. The assembly of claim 1 wherein said mid-plane board further comprises:
   (i) a first outwardly extending connection portion adapted for connection to a first connector means, said first connector means for receiving signals associated with a respective one of said cards in said first group of at least two circuit cards and a respective one of said cards in said second group of at least two circuit cards, said signals for controlling said order of interconnection of said first group of cards to said second group of cards; and
   (ii) electrically conductive means for transferring said controlling signals from said connection portion to said associated one of said second and said third groups of pins.

* * * * *